United States Patent [19]
Nakajima

[11] Patent Number: 5,623,171
[45] Date of Patent: Apr. 22, 1997

[54] HIGH-VOLTAGE PULSE GENERATING CIRCUIT AND ELECTROSTATIC RECIPITATOR CONTAINING IT

[75] Inventor: Shin Nakajima, Kumagaya, Japan

[73] Assignee: Hitachi Metals, Ltd., Tokyo, Japan

[21] Appl. No.: 573,863

[22] Filed: Dec. 18, 1995

Related U.S. Application Data

[63] Continuation of Ser. No. 58,073, Sep. 14, 1990, abandoned.

[30] Foreign Application Priority Data

Sep. 14, 1989 [JP] Japan ................... 1-239170

[51] Int. Cl.$^6$ ................ H03K 3/30; B03C 3/02
[52] U.S. Cl. ................ 307/106; 323/247
[58] Field of Search .............. 323/247, 249, 323/259; 307/108, 110, 282, 106

[56] References Cited

U.S. PATENT DOCUMENTS

| | | | |
|---|---|---|---|
| 4,730,166 | 3/1988 | Birx et al. | 328/233 |
| 4,767,959 | 8/1988 | Sakakibara et al. | 310/317 |
| 4,812,770 | 3/1989 | Dravkin | 328/67 |

FOREIGN PATENT DOCUMENTS

| | | | |
|---|---|---|---|
| 57-43062 | 9/1982 | Japan | B03C 3/66 |
| 59-159671 | 9/1984 | Japan | B03M 7/06 |
| 61-185350 | 8/1986 | Japan | B03C 3/66 |
| 64-65889 | 3/1989 | Japan | H01S 3/091 |

OTHER PUBLICATIONS

"A Pulse Voltage Source for Electrostatic Precipitators," Conf. Rec. of IEEE/IAS Annu. Meet., pp. 23–30, IC(1978).
"The Use of Saturable Reactors as Discharge Devices for Pulse Generators," W.S. Melville, Proceedings of Institute of Electrical Engineers, (London) vol. 98, Part 3, No. 53, pp. 185–207 (1951).
D. Birx, E. Cook, S. Hawkins, S. Poor, L. Reginato, J. Schmidt, M. Smith: "The Application of Magnetic Switches as Pulse Sources for Induction Linacs," IEEE Transactions on Nuclear Science, vol. NS–30, No.4.
"High–Power Magnetic–Thyristor Generator with a High Pulse–Repetition Frequency", *Instruments and Experimental Techniques*, 27(1984) Jan.–Feb, No.1, Part 2, New York.

*Primary Examiner*—Aditya Krishnan
*Attorney, Agent, or Firm*—Sughrue, Mion, Zinn, Macpeak & Seas

[57] ABSTRACT

A high-voltage pulse generating circuit of a charge transfer-type comprising a main capacitor for storing input energy and at least one magnetic pulse compression circuit comprising a saturable reactor, a saturable reactor on the side of a load comprising an energy recovery winding connected to the main capacitor via a rectifying element for returning unconsumed pulse energy from the load to the main capacitor. This circuit is suitable for an electrostatic precipitator.

7 Claims, 8 Drawing Sheets

HIGH-VOLTAGE PULSE GENERATING CIRCUIT AND ELECTROSTATIC RECIPITATOR CONTAINING IT

This is a continuation of application Ser. No. 07/582,073 filed Sep. 14, 1990, now abandoned.

BACKGROUND OF THE INVENTION

The present invention relates to a high-voltage pulse generating circuit and a pulse charge-type electrostatic precipitator containing it, and more particularly to a high-voltage pulse generating circuit comprising at least one magnetic pulse compression circuit and an electrostatic precipitator containing such a high-voltage pulse generating circuit.

The pulse charge system is a system in which pulse voltage is generated by the charge-discharge function of a capacitor and added to a de voltage supplied from a de power supply. In an electrostatic precipitator utilizing this system, high-density corona is generated to charge dust efficiently only when pulse is applied. And since corona is not always generated, an average current level can be kept minimum, so that energy consumption is low, and the reduction of reverse voltage can be effectively prevented. As a result, high-electric resistivity dust which cannot be collected by other methods such as an intermittent charging method can be collected by the pulse charge system.

A typical conventional electrostatic precipitator of a pulse charge type is disclosed by Japanese Patent Publication No. 57-43062, Japanese Patent Laid-Open Nos. 59-159671 and 61-185350.

Figure 7:
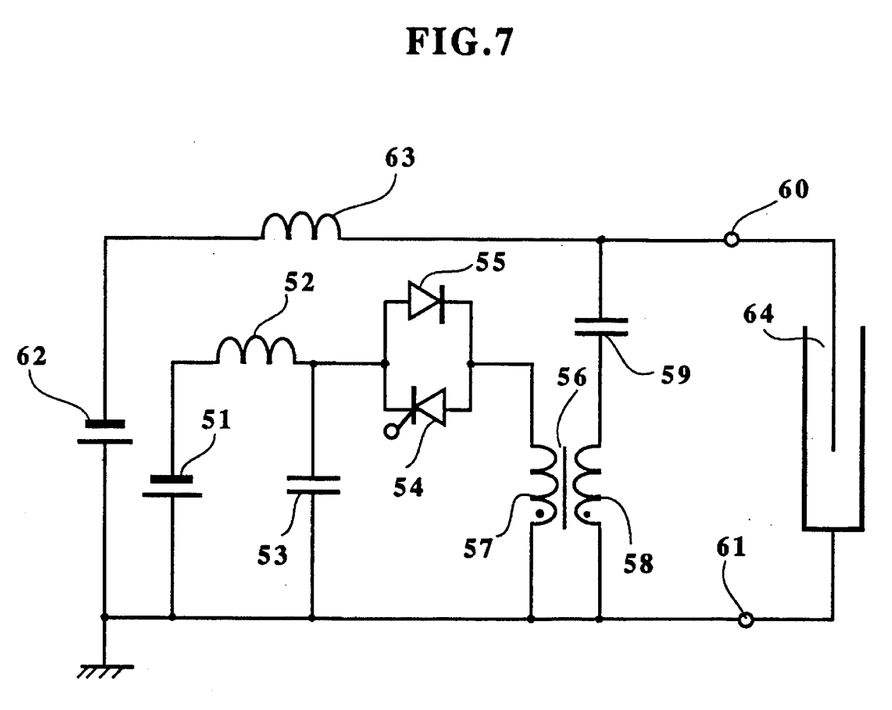
FIG. 7 is a schematic view showing a conventional circuit for an electrostatic precipitator.

The pulse charge-type electrostatic precipitator disclosed by Japanese Patent Publication No. 57-43062 comprises a high-voltage pulse generating circuit as shown in FIG. 7, which comprises a high-dc voltage generating circuit and an input power supply of the high-voltage pulse generating circuit independently. In FIG. 7, 51 denotes a input power supply of the high-voltage pulse generating circuit; 52 an inductor for charging a main capacitor 53 which serves to store input energy; 54 a switching element for releasing charges stored in the main capacitor 53; 55 a rectifying element for permitting energy to return from a capacitor constituted by dust precipitator electrodes 64 to the main capacitor 53; 56 an inductance element for causing L-C resonance together with a capacitor 59 and a capacitor constituted by the dust precipitator electrodes 64. The capacitor 59 serves to block dc current from flowing from a high-dc voltage generating circuit constituted by the main capacitor 53, a high-voltage dc power supply 62 and an inductor 63 to the high-voltage pulse generating circuit when the switching element 54 is turned on. The inductance element 56 is typically a transformer for increasing pulse voltage applied to the dust precipitator electrodes 64, which comprises a primary winding 57 and a secondary winding 58. Further, in FIG. 7, 60 denotes a negative output terminal of the high-voltage pulse generating circuit connected to a negative input terminal of the dust precipitator electrodes 64, and 61 denotes a positive output terminal of the high-voltage pulse generating circuit connected to a positive input terminal of the dust precipitator electrodes 64. The inductor 63 serves to charge the capacitor constituted by the dust precipitator electrodes 64, and blocks high-voltage pulse generated by the high-voltage pulse generating circuit from flowing into the high-voltage dc power supply 62.

In this electrostatic precipitator containing the high-voltage pulse generating circuit disclosed by Japanese Patent Publication No. 57-43062, energy transferred to the capacitor constituted by the dust precipitator electrodes 64 can be returned to the main capacitor 53, so that energy supplied from the dc power supply to the main capacitor 53 and its consumption can be reduced. As a result, high-resistivity dust can be efficiently collected in practical operations.

However, in the high-voltage pulse generating circuit contained in the pulse charge-type electrostatic precipitator disclosed by Japanese Patent Publication No. 57-43062, it is required for the purpose of reducing energy consumption that a high-voltage pulse output of the high-voltage pulse generating circuit have a smaller pulse width, thereby reducing average output current, and it is also required for the purpose of increasing the service life of the apparatus that the switching element 54 have longer service life and higher reliability.

Accordingly, semiconductor switching elements such as high-speed thyristors, GTO thyristors, etc. are used as the switching element 54, and a plurality of such semiconductor switching elements are used in series to achieve higher breakdown voltage and larger current flow. However, when a plurality of semiconductor switching elements are connected in series to constitute the switching element 54, the pulse width of the high-voltage pulse output of the high-voltage pulse generating circuit can be reduced only to about 30 μs, because each semiconductor switching element constituting the switching element 54 has a critical current increase ratio of at most several hundreds of A/μs or so and a turn-on period of several μs at an absolute maximum rating. Therefore, the average output current of the high-voltage pulse generating circuit cannot sufficiently be reduced, thereby failing to achieve sufficient reduction of energy consumption.

On the other hand, if the pulse width of the high-voltage pulse is further reduced for the purpose of reducing energy consumption, the semiconductor switching elements have insufficient margin with respect to a critical current increase ratio or a turn-on period at an absolute maximum rating, resulting in poor reliability.

Incidentally, the details of the pulse charge-type electrostatic precipitator utilizing the semiconductor switching element are described in "A Pulse Voltage Source For Electrostatic Precipitators," Conf. Rec. of IEEE/IAS Annu. Meet., pp. 23–30, IC (1978).

OBJECT AND SUMMARY OF THE INVENTION

Accordingly, an object of the present invention is to provide a high-voltage pulse generating circuit capable of reducing a pulse width of a high-voltage pulse output without deteriorating the reliability of a main switching element and also capable of being operated at low energy consumption even when there is extremely large energy unconsumed by a load.

Another object of the present invention is to provide an electrostatic precipitator comprising such a high-voltage pulse generating circuit.

Thus, the high-voltage pulse generating circuit according to the present invention comprises a main capacitor for storing input energy and at least one magnetic pulse compression circuit comprising a saturable reactor, a saturable reactor on the side of a load comprising an energy recovery winding connected to the main capacitor via a rectifying element for returning unconsumed pulse energy from the load to the main capacitor.

The electrostatic precipitator according to the present invention comprises a high-voltage pulse generating circuit comprising a main capacitor for storing input energy and at least one magnetic pulse compression circuit comprising a saturable reactor, a saturable reactor on the side of a load comprising an energy recovery winding connected to the main capacitor via a rectifying element for returning unconsumed pulse energy from the load to the main capacitor.

DETAILED DESCRIPTION OF THE INVENTION

In the present invention, a high-voltage pulse generating circuit comprising at least one so-called magnetic pulse compression circuit is used for the purpose of reducing a pulse width.

The details of the high-voltage pulse generating circuit comprising magnetic pulse compression circuits are described in "The Use of Saturable Reactors As Discharge Devices for Pulse Generators," W. S. Melville, Proceedings of Institute of Electrical Engineers, (London) Vol. 98, Part 3, No. 53, pp. 185–207 (1951); D. Birx, E. Cook, S. Hawkins, S. Poor, L. Reginato, J. Schmidt and M. Smith: "The Application of Magnetic Switches as Pulse Sources for Induction Linacs," IEEE Transactions on Nuclear Science, Vol. NS-30, No. 4, pp. 2763–2768 (1983), and U.S. Pat. No. 4,730,166.

Figure 8:
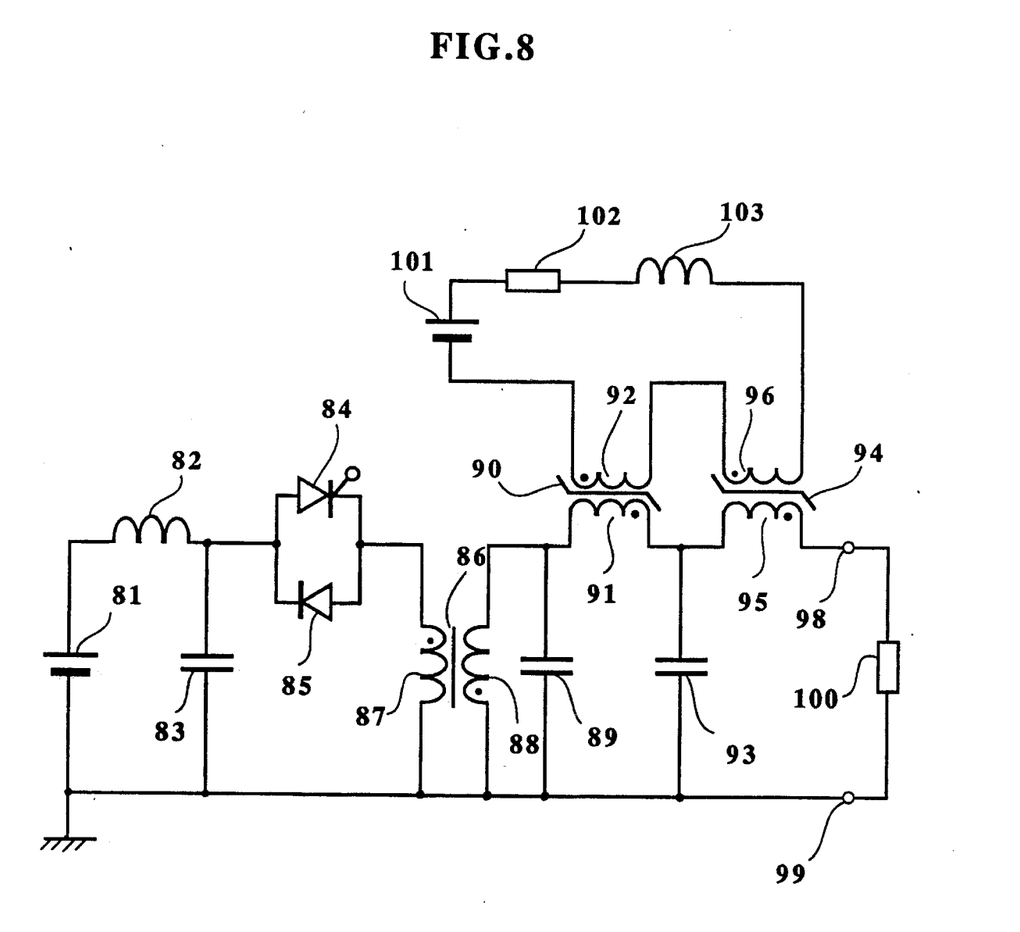
FIG. 8 is a conventional high-voltage pulse generating circuit comprising a magnetic pulse compression circuit.

Before delving into the details of the high-voltage pulse generating circuit according to the present invention, a typical high-voltage pulse generating circuit comprising two magnetic pulse compression circuits 90 and 94 will be explained referring to FIG. 8. In this high-voltage pulse generating circuit, since energy uncomsumed by a load 100 cannot be returned to the input side, the energy efficiency of the high-voltage pulse generating circuit is extremely low particularly when there is extremely large energy unconsumed by the load 100 as in the case of a pulse charge-type electrostatic precipitator, etc. Thus, it cannot be used for practical purpose.

If the high-voltage pulse generating circuit comprises a single magnetic pulse compression circuit, it would be possible to return the unconsumed energy from the load 100 to the main capacitor 83 via a rectifying element. However, sufficient energy recovery cannot be expected because of the energy loss in a saturable reactor constituting the magnetic pulse compression circuit and a transformer.

To achieve the efficient recovery of unconsumed energy from the load in the high-voltage pulse generating circuit comprising magnetic pulse compression circuits, it has been found that a saturable reactor constituting a magnetic pulse compression circuit on the side of the load should be provided with an energy recovery winding connected to a rectifying element which in turn is connected to a main capacitor for recovering the unconsumed energy from the load to the input side.

Because of the above structure, the pulse width of output pulse can be reduced, which is difficult in the charge transfer-type high-voltage pulse generating circuit containing magnetic pulse compression circuits as disclosed in Japanese Patent Publication No. 57-43062.

In addition, after pulse energy is supplied to the load, it can be returned to the main capacitor without passing through the transformer. Thus, problems inherent in the conventional charge transfer-type high-voltage pulse generating circuit containing magnetic pulse compression circuits can be solved. Because of the structure of the high-voltage pulse generating circuit according to the present invention, energy consumption can be extremely reduced, resulting in a high-efficiency high-voltage pulse generating circuit.

In the present invention, the output winding and the energy recovery winding are insulated from each other in the saturable reactor, efficient recovery of energy can be achieved. On the other hand, when there is no insulation between the output winding and the energy recovery winding, high voltage is applied to the rectifying element connected to the energy recovery winding, so that a high-breakdown voltage rectifying element should be used. Accordingly, high-speed, low-loss operation cannot be expected.

Further, in the present invention, by setting the number of winding of the energy recovery winding smaller than that of the output winding, it is possible to reduce reverse voltage applied to the rectifying element series-connected to the energy recovery winding. Accordingly, a high-speed, low-loss rectifying element can be used, resulting in the reduction of energy consumption and high reliability.

In the present invention, the magnetic pulse compression circuit may be constituted by two or more saturable reactors. In this case, an energy recovery winding is only needed in at least one saturable reactor on the side of a load.

In the high-voltage pulse generating circuit of the present invention, when the saturable reactor constituting the magnetic pulse compression circuit is provided with a reset circuit for changing the operating magnetic flux density of the saturable reactor depending upon input power supply voltage, the timing of the saturation of the saturable reactor can be controlled. Accordingly, even when the input power supply voltage varies, pulse energy can be supplied efficiently.

In the pulse charge-type electrostatic precipitator utilizing the high-voltage pulse generating circuit, the pulse width of high-voltage pulse applied to the dust precipitator electrodes can be easily reduced to increase the efficiency of collecting high-resistivity dust, and energy can be recovered from the dust precipitator electrodes. Accordingly, the average current of the high-voltage dc power supply can be reduced without deteriorating reliability.

The present invention will be explained in further detail referring to the drawings.

Figure 1:
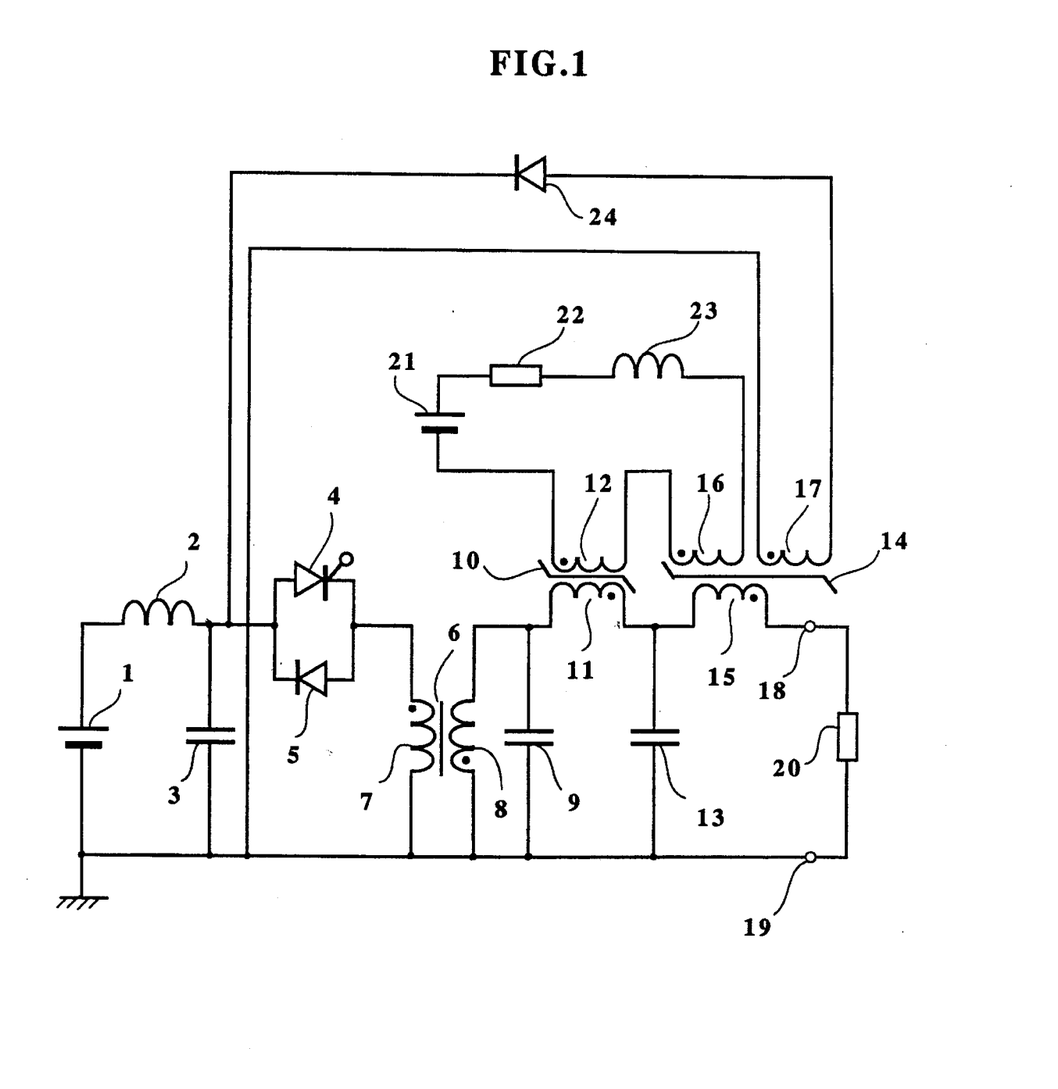
FIG. 1 is a schematic view showing a high-voltage pulse generating circuit according to a first embodiment of the present invention including a saturable reactor having an energy recovery winding.

FIG. 1 shows a high-voltage pulse generating circuit according to an embodiment of the present invention. In this high-voltage pulse generating circuit, a switching element 4 for releasing charges stored in a main capacitor 3 is constituted by a semiconductor switching element such as a high-speed thyristor, a GTO thyristor, etc.

In FIG. 1, the high-voltage pulse generating circuit comprises a high-voltage dc power supply 1, a main capacitor 3 for storing input energy, an inductor 2 connected between the high-voltage dc power supply 1 and the main capacitor 3 for charging the main capacitor 3, a semiconductor switching element 4 connected to the main capacitor 3 for releasing charges stored in the main capacitor 3, a rectifying element 5 connected to the main capacitor 3 in parallel with the switching element 4 for permitting reverse current to flow into the main capacitor 3, a transformer 6 for increasing pulse voltage to be applied to a capacitor 9. The transformer 6 serves as an inductance element for causing L-C resonance together with the main capacitor 3 and the capacitor 9 when the semiconductor switching element 4 is turned on. The transformer 6 comprises a primary winding 7 and a secondary winding 8. The capacitor 9 is inserted between the two terminals of the transformer 6 in parallel. The high-voltage pulse generating circuit further comprises a first saturable reactor 10 for magnetic pulse compression which comprises an output winding 11 and a reset winding 12, a capacitor 13 connected to the first saturable reactor 10 in parallel, a second saturable reactor 14 for magnetic pulse compression which comprises an output winding 15, an reset winding 16 and an energy recovery winding 17 for returning unconsumed energy from a load 20 to the main capacitor 3, a negative output terminal 18 connected to a negative input terminal of the load 20, and a positive output terminal 19 connected to a positive input terminal of the load 20. The reset winding 12 and the reset winding 16 are connected in series, and a dc power supply 21 for supplying reset current to the first and second saturable reactors 10, 14, a resistor 22 for restricting the reset current and an inductor 23 for blocking surge voltage induced in the reset windings 12, 16 are connected in series to the reset windings 12, 16. A rectifying element 24 is inserted between the energy recovery winding 17 and the main capacitor 3 for permitting unconsumed energy to return from the load 20 to the main capacitor 3.

In this embodiment, the energy recovery winding 17 provided in the second saturable reactor 14 in the polarity shown in FIG. 1 and the rectifying element 24 series-connected to the energy recovery winding 17 constitute an energy recovery circuit for returning unconsumed energy from the load 20 to the main capacitor 3. By this energy recovery circuit, the unconsumed energy of the load 20 can be efficiently reutilized, resulting in the increase in efficiency of the high-voltage pulse generating circuit itself. In this case, by setting the magnetic flux density of the second saturable reactor 14 such that it is saturated only during the period in which energy is supplied to the load 20, and not saturated when unconsumed energy is recovered from the load 20, the recovery efficiency of the unconsumed energy from the load 20 by way of the energy recovery winding 17 of the second saturable reactor 14 can be drastically increased.

Further, in this embodiment, by utilizing the two-stage magnetic pulse compression circuits each containing a saturable reactor, sharp high-voltage pulse having a wave height of about several tens of kV or more and a pulse width of about ten µs or less can be applied to the load 20. Accordingly, critical current increase ratio of the semiconductor switching element can be extremely reduced. Therefore, it is easy to have a sufficient margin with respect to current wave height and critical current increase ratio to achieve the safe operation of the semiconductor switching element, resulting in higher reliability of the high-voltage pulse generating circuit. Further, as a semiconductor switching element, elements having relatively small current wave height or critical current increase ratio can be used, or the number of switching elements connected in series or in parallel can be reduced.

In this embodiment, the reset windings 12, 16 of the two saturable reactors 10, 14 are connected in series, and the saturable reactors 10, 14 are reset by a single reset circuit. However, separate reset circuits can be provided in the saturable reactors to always maintain optimum the energy transfer efficiency from the main capacitor 3 to the load 20, even when the input power supply voltage varies.

Incidentally, the magnetic cores of the saturable reactors 10, 14 in the magnetic pulse compression circuit can be constituted by amorphous, magnetic alloy ribbons or Fe-base, fine crystalline alloy ribbons as disclosed by Japanese Patent Laid Open Nos. 64-65889 and 1-110713, with polymer films or MgO coatings interposed between adjacent alloy ribbon layers.

Figure 2:
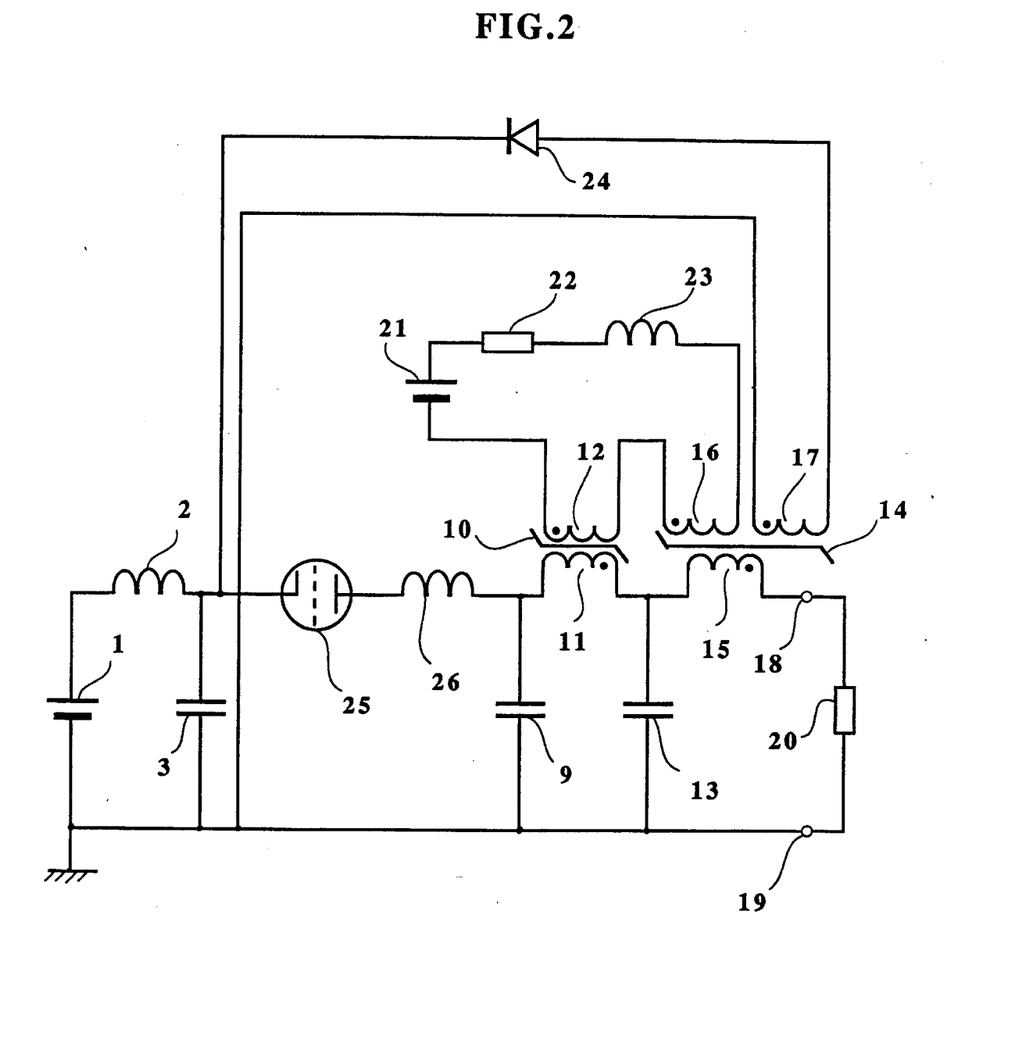
FIG. 2 is a schematic view showing a high-voltage pulse generating circuit according to a second embodiment of the present invention where the semiconductor switching element of FIG. 1 is replaced with a discharge tube switching element of FIG. 1.

FIG. 2 shows a high-voltage pulse generating circuit according to another embodiment of the present invention. In this embodiment, the switching element for releasing charges stored in the main capacitor 3 is constituted by a discharge tube switching element such as a thyratron. An inductor 26 is connected to the discharge tube switching element 25 to control the anode current rise of the discharge tube switching element 25. With respect to the other elements, the embodiment in FIG. 2 is the same as that in FIG. 1.

In the embodiment of FIG. 2, in addition to the effects obtained in the embodiment of FIG. 1, the following effects can be provided: In the high-voltage pulse generating circuit of this embodiment, since current flowing through the discharge tube switching element 25 when it is turned on can have a reduced wave height and an elongated pulse width, the discharge tube switching element can have extremely reduced switching loss. Accordingly, the short service life of the discharge tube switching element which is a problem inherent in this type of switching element can be overcome.

Incidentally, instead of using the discharge tube switching element, a rotary spark gap as disclosed, for instance, in Japanese Patent Laid Open No. 61-185350 can be used to achieve the same effects.

Figure 3:
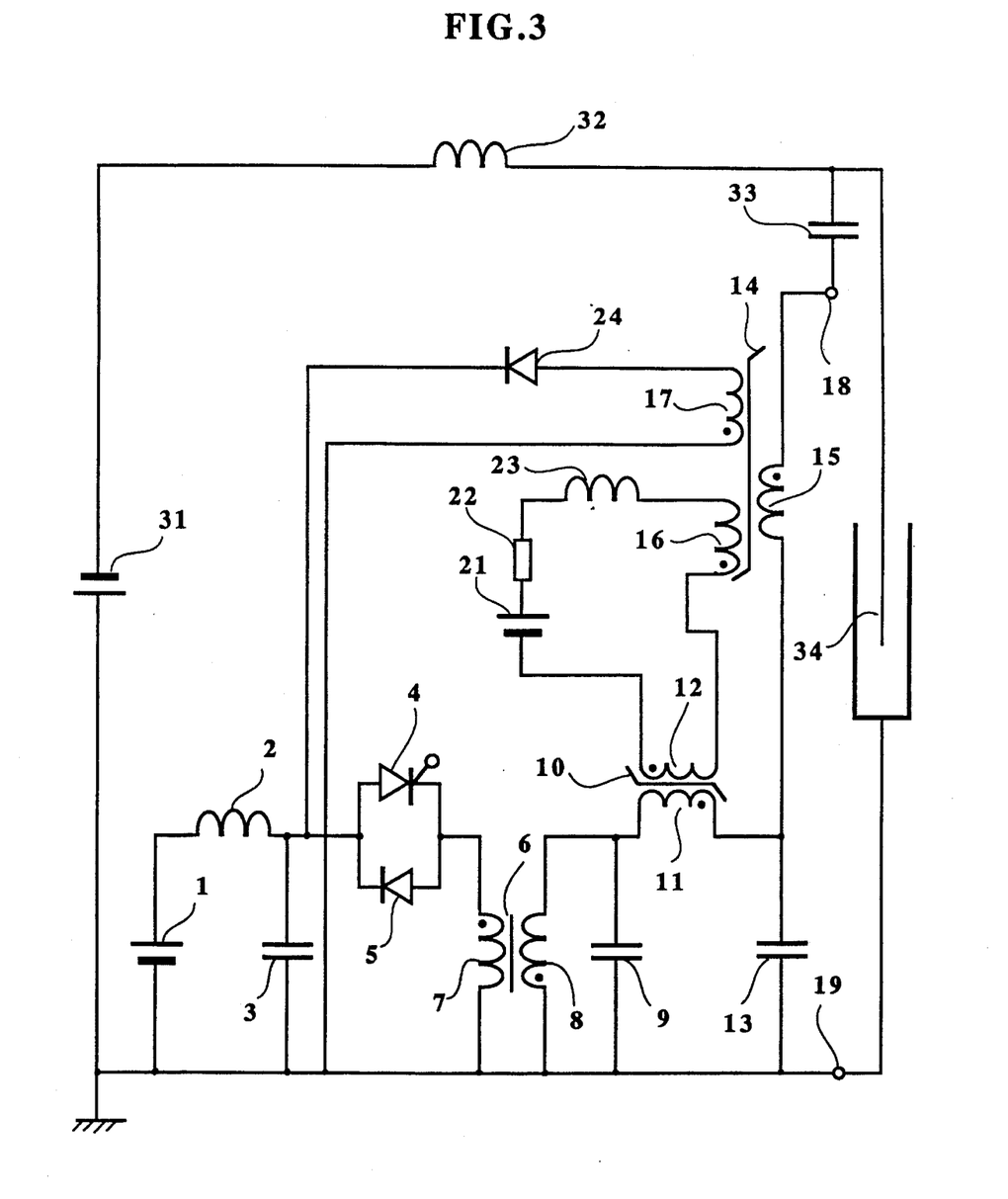
FIG. 3 is a schematic view showing a circuit for an electrostatic precipitator according to a third embodiment of the present invention which includes a high-voltage generating circuit as shown in FIG. 1.

FIG. 3 shows an electrostatic precipitator according to a further embodiment of the present invention. The electrostatic precipitator of this embodiment is constituted by a high-dc voltage generating circuit, a high-voltage pulse generating circuit and dust precipitator electrodes as in the system disclosed by Japanese Patent Publication No. 57-43062.

In this embodiment, the high-voltage pulse generating circuit itself is the same as that in FIG. 1. In this respect, the electrostatic precipitator shown in FIG. 3 is distinguishable from that shown in Japanese Patent Publication No. 57-43062. The high-dc voltage generating circuit in FIG. 3 is constituted by a high-voltage dc power supply 31 and an inductor 32 inserted between the high-voltage dc power supply 31 and one terminal of the dust precipitator electrodes 34 for blocking the high-voltage pulse supplied from the high-voltage pulse generating circuit from flowing into the high-voltage dc power supply 31. As shown in FIG. 3, a capacitor 33 is provided such that dc output current supplied from the high-dc voltage generating circuit is prevented from flowing into the high-voltage pulse generating circuit.

In this embodiment, the reduction of a pulse width of output voltage of the high-voltage pulse generating circuit and high reliability and long service life of the semiconductor switching element can be achieved simultaneously, which are difficult in the conventional pulse-charge type electrostatic precipitator utilizing a semiconductor switching element. Thus, low power operation and high reliability can be achieved.

Figure 4:
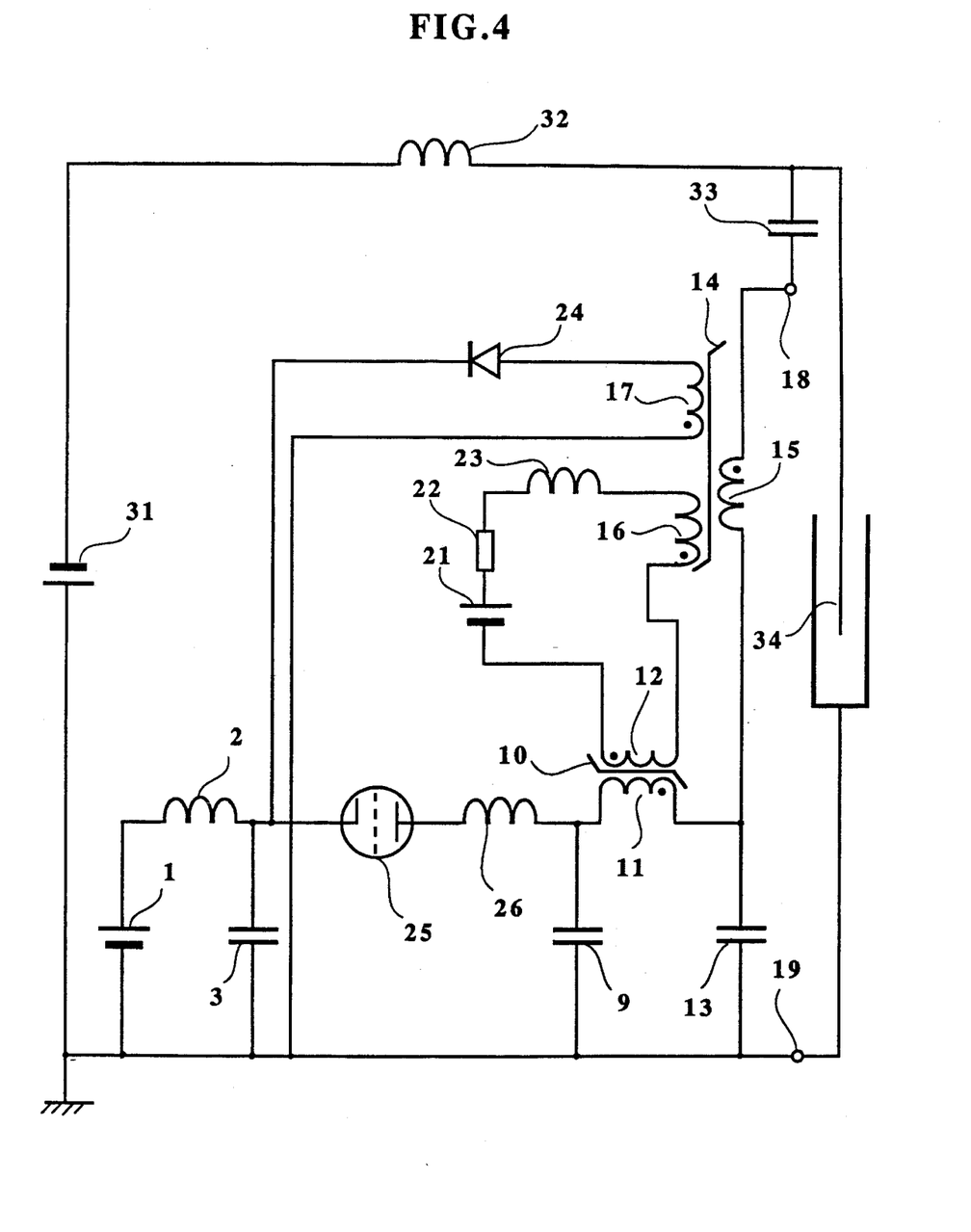
FIG. 4 is a schematic view showing a circuit for an electrostatic precipitator according to a forth embodiment of the present invention where the semiconductor switching element of FIG. 3 is replaced with a discharge tube switching element of the high-voltage pulse generating circuit.

FIG. 4 shows an electrostatic precipitator according to a further embodiment of the present invention. The electrostatic precipitator according to this embodiment is also constituted by a high-dc voltage generating circuit, a high-voltage pulse generating circuit and dust precipitator electrodes in the same manner as shown in FIG. 3.

Except for utilizing a discharge tube switching element instead of the semiconductor switching element, the electrostatic precipitator in FIG. 4 is the same as that shown in FIG. 3. In this embodiment, higher reliability and long service life of the discharge tube switching element can be achieved, which are difficult in the conventional pulse charge- type electrostatic precipitator utilizing a discharge tube switching element. Thus, low power operation and high reliability can be achieved.

Incidentally, instead of the discharge tube switching element used in this embodiment, other gap switches such as a rotary spark gap can be used to achieve the same effects.

Figure 5:
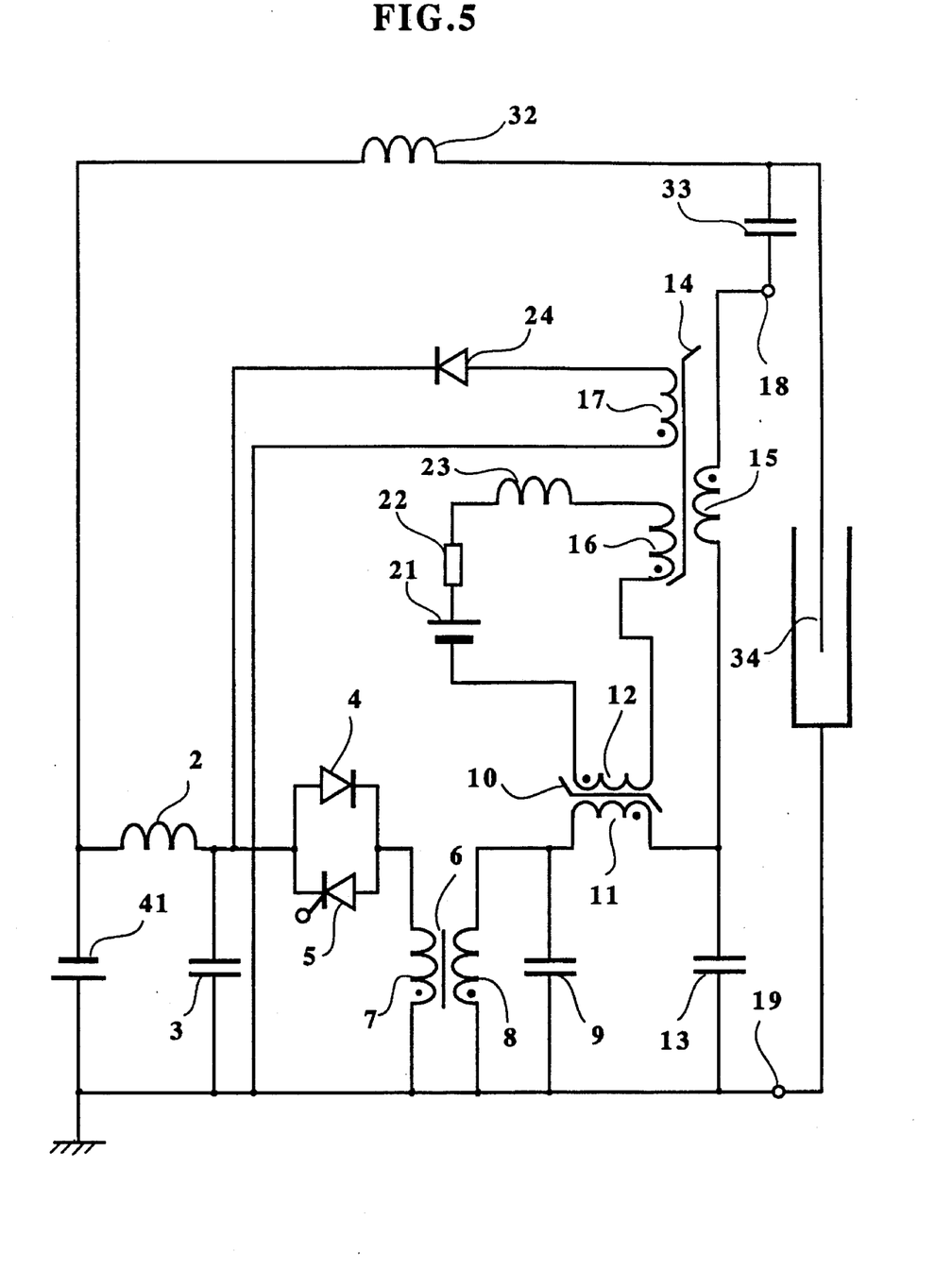
FIG. 5 is a schematic view showing a circuit for an electrostatic precipitator according to a fifth embodiment of the present invention where a power supply of the high-voltage pulse generating circuit also serves as a power supply of a high DC voltage generating circuit.

FIG. 5 shows an electrostatic precipitator according to a further embodiment of the present invention. In this electrostatic precipitator, a power supply 41 of the high-voltage pulse generating circuit also serves as a power supply of a high-dc voltage generating circuit. With respect to the other structure, this electrostatic precipitator is the same as shown in FIG. 3.

In this embodiment, the reduction of a pulse width of output voltage of the high-voltage pulse generating circuit and high reliability and long service life of the semiconductor switching element can be achieved simultaneously, which are difficult in the conventional pulse-charge type electrostatic precipitator utilizing a semiconductor switching element. Thus, low power operation and high reliability can be achieved.

Figure 6:
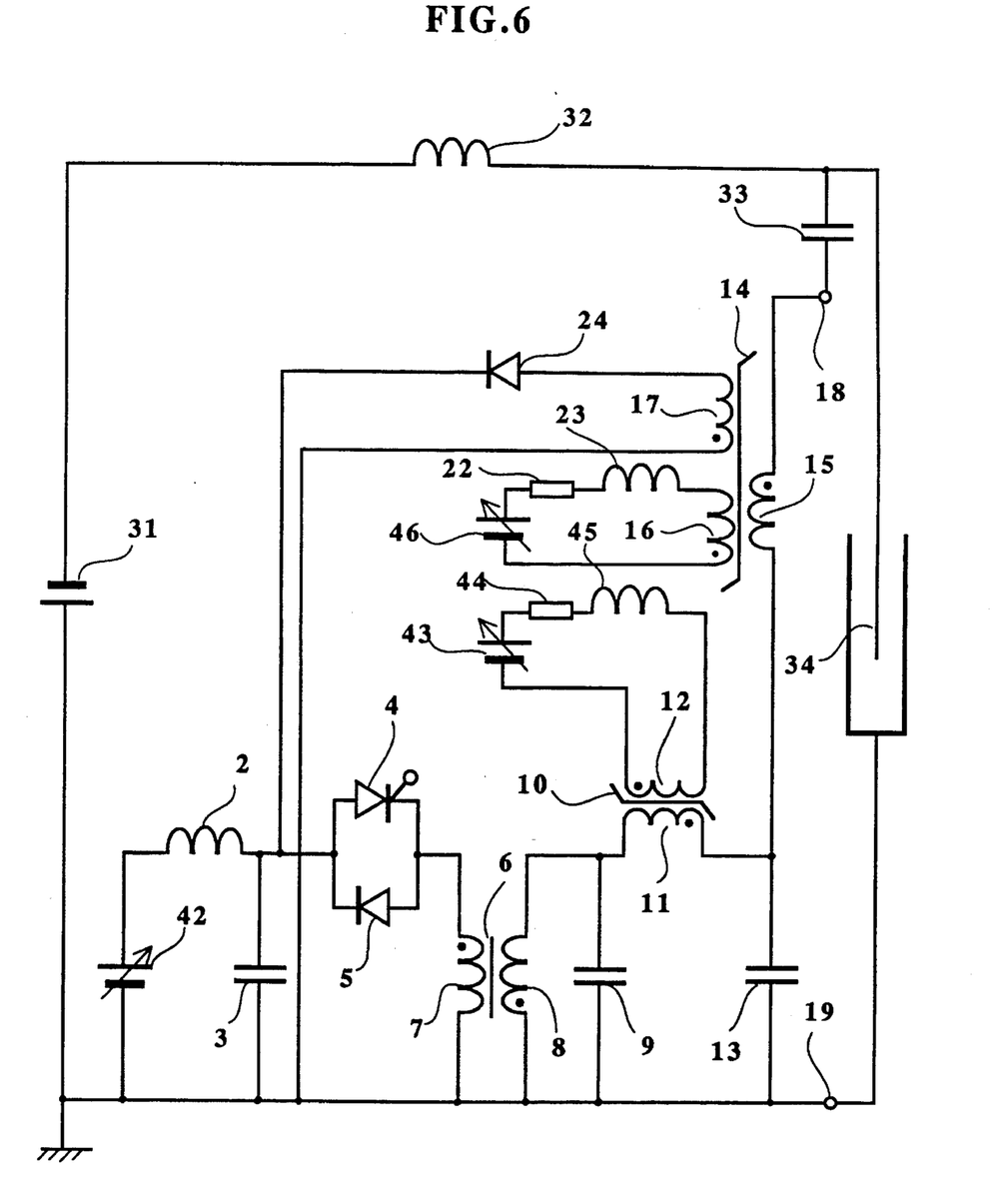
FIG. 6 is a schematic view showing a circuit for an electrostatic precipitator according to a sixth embodiment of the present invention where the output voltage of the high-voltage pulse generating circuit can be changed and each magnetic compression circuit has a reset circuit.

FIG. 6 shows an electrostatic precipitator according to a further embodiment of the present invention. In this embodiment, output voltage of the high-voltage pulse generating circuit can be changed. The electrostatic precipitator of this embodiment has an essential circuit structure which is the same as in FIG. 3, except that a high-voltage dc power supply 42 of the high-voltage pulse generating circuit is variable, and that saturable reactors 10, 14, each constituting a magnetic pulse compression circuit have separate reset circuits to make the reset current variable.

The reset circuit of the saturable reactor 10 is constituted by a reset winding 12, a variable dc power supply 43 for supplying reset current, a resistor 44 for limiting the reset current, and an inductor 45 for blocking surge current induced in the reset winding 12. The voltage of the variable dc power supply 43 can be changed depending upon the voltage level of the high-voltage dc power supply 42 to change the reset current, so that the saturable reactor 10 is saturated at the timing that maximum charges are supplied into the capacitor 9 from the main capacitor 3 via a switching element 4 and a transformer 6 after a switching element 4 is turned on.

With respect to the reset circuit of the saturable reactor 14, it has the same function as that of the saturable reactor 10.

This embodiment provides a high-efficiency electrostatic precipitator with variable output voltage.

As described above in detail, according to the present invention, unconsumed energy can be efficiently recovered from the load with high reliability. Particularly when this high-voltage pulse generating circuit is utilized in a charge transfer-type electrostatic precipitator, the pulse width of pulse output can be reduced without deteriorating reliability, which was conventionally difficult. Thus, the electrostatic precipitator of the present invention enjoys low energy consumption and high reliability.

What is claimed is:

1. A high-voltage pulse generating circuit of a charge transfer-type comprising:

a main capacitor for storing input energy, a transformer, having a primary winding and a secondary winding, connected between said main capacitor and a load, at least one magnetic pulse compression circuit comprising a saturable reactor, and an energy recovery circuit for returning unconsumed pulse energy from said load to said main capacitor, said saturable reactor being connected to an output winding of said at least one magnetic pulse compression circuit, to said secondary winding of said transformer, and to an energy recovery winding, said energy recovery winding being connected in parallel to said main capacitor, and a rectifying element inserted between said energy recovery winding and said main capacitor.

2. The high-voltage pulse generating circuit according to claim 1, wherein a reset circuit is provided for changing an operating magnetic flux density of said saturable reactor depending upon an input power supply voltage.

3. The high-voltage pulse generating circuit according to claim 1, wherein said load is an electrostatic precipitator.

4. The high-voltage pulse generating circuit according to claim 2, wherein said load is an electrostatic precipitator.

5. An electrostatic precipitator circuit comprising:

a high-voltage pulse generating circuit which includes a main capacitor for storing input energy, a transformer, having a primary winding and a secondary winding, connected between said main capacitor and a load;

and at least one magnetic pulse compression circuit, connected to said secondary winding of said transformer, comprising a first saturable reactor, a second saturable reactor on the side of said load, said second saturable reactor comprising an energy recovery winding connected to said main capacitor via a rectifying element for returning unconsumed pulse energy from said load to said main capacitor, where the magnetic flux density of the saturable reactor is set such that the saturable reactor is saturated only during the period in which energy is supplied to the load, and not saturated when unconsumed energy is recovered from the load.

6. The electrostatic precipitator circuit according to claim 5, wherein said saturable reactor comprises a reset circuit for changing an operating magnetic flux density of said saturable reactor depending upon an input power supply voltage.

7. The high-voltage pulse generating circuit according to claim 2, wherein said high-voltage pulse generating circuit further comprises another saturable reactor connected to an output winding and to another reset winding of said reset circuit.

* * * * *